United States Patent [19]

Knoedl, Jr.

[11] Patent Number: 5,434,541
[45] Date of Patent: Jul. 18, 1995

[54] FREQUENCY TRANSLATED FILTER FOR A MICRO-MINIATURE RADIO RECEIVER

[75] Inventor: George Knoedl, Jr., Milford, N.J.

[73] Assignee: AT&T Corp., Murray Hill, N.J.

[21] Appl. No.: 268,486

[22] Filed: Jun. 30, 1994

[51] Int. Cl.⁶ ............................................. H03F 3/191
[52] U.S. Cl. .................................... 330/306; 330/254; 455/255
[58] Field of Search ................... 363/98, 138; 330/51, 330/110, 254, 282, 283, 293, 306; 455/232.1, 234.1, 237.1, 255, 256, 266

[56] References Cited

U.S. PATENT DOCUMENTS

| | | | |
|---|---|---|---|
| 3,406,325 | 10/1968 | Rosa | 363/138 |
| 4,455,599 | 6/1984 | Tamura et al. | 363/138 |
| 4,864,483 | 9/1989 | Divan | 363/132 X |
| 4,916,381 | 4/1990 | Gelecinskyj et al. | 323/285 |
| 5,099,410 | 3/1992 | Divan | 363/132 X |
| 5,208,738 | 5/1993 | Jain | 363/98 X |
| 5,239,521 | 8/1993 | Blonder | 368/10 |
| 5,329,439 | 7/1994 | Borojevic et al. | 363/127 X |

OTHER PUBLICATIONS

"A Practical Method of Designing RC Active Filters," R. P. Sallen and E. L. Key, IRE Transactions—Circuit Theory, pp. 74–85, Mar., 1955.

Donald E. Norgaard, "The Phase Shift Method of Single-Sideband Signal Generation," Proceedings of the IRE, Dec. 1956, pp. 1718–1735.

J. Y.-C. Chang, Asad A. Abidi, and Michael Gaitan, "Large Suspended Inductors on Silicon and Their Use in a 2-lm COS RF Amplifier," IEEE Electron Device Letters, vol. 14, No. 5, May 1993, pp. 246–248.

Primary Examiner—James B. Mullins

[57] ABSTRACT

A frequency translated filter adapted for integration into a conventional monolithic integrated circuit arrangement. The filter includes an RF amplifier having a gain determining port; a one port, AF (audio frequency), frequency selective, gain determining immittance network; a forced-commutated bridge of bilateral switching elements interconnecting the immittance network and the gain affecting port of the amplifier, and an RF local oscillator for providing a commutating drive signal to the bridge. The action of the RF commutating bridge is to convert the voltage and current appearing at the gain affecting port of the RF amplifier to a low frequency at the terminals of the AF immittance network, and to reflect the immittance of the AF network back through the RF commutating bridge, translating it up again in frequency. The effect is to permit the use of AF frequency selective elements to render an amplifier frequency selective at radio frequencies.

29 Claims, 4 Drawing Sheets

AF NETWORK ADMITTANCE,
$y_n$ -VS- FREQUENCY

TRANSLATED ADMITTANCE,
$y_a$ AND RF AMPLIFIER CHARACTERISTIC -VS- FREQUENCY

FREQUENCY TRANSLATED FILTER FOR A MICRO-MINIATURE RADIO RECEIVER

BRIEF DESCRIPTION OF THE INVENTION

The present invention relates to micro-miniature receivers. More particularly, it relates to the implementation of an integrated filter in a RF amplifier.

BACKGROUND OF THE INVENTION

Miniature receivers, such as cellular telephones are well known in the art. While those receivers have advanced to a sophisticated level, there are still a number of shortcomings.

One particular shortcoming arises in the miniaturization of such a receiver. Downsizing a radio receiver has proven to be problematic in that the conventional components of a radio receiver are typically bulky components relative to the overall size of the miniature radio receiver and are not readily adaptable to be implemented in a miniature receiver.

The primary task of a radio receiver is to separate the desired signal from a plurality of other signals in a common electromagnetic spectrum, both in-band and out-of-band, whose signal strengths range over many orders of magnitude. The task of separating these signals which differ in frequency are typically accomplished through frequency selective filters.

The task of separating the signals is twofold. First, the receiver's frequency of sensitivity must be tuned to that of the desired channel signal. Second, the bandwidth of sensitivity of the receiver must be restricted to that of only the desired channel signal while rejecting all frequencies outside of this bandwidth, thus separating the desired channel signal from all other signals.

Typically, these two tasks have been implemented separately. In conventional systems, the channel bandwidth is typically very narrow, perhaps 3 kHz or 30 kHz for a telephone quality voice channel. By comparison, carrier frequencies may range from tens of MHz to several GHz. To effect this selectivity at carrier frequency, the receiver typically utilizes a filter bandwidth in the order of 0.01% or less of the carrier frequency. Such narrow bandwidths require filter element quality factors (Q) in excess of 10,000, which become increasingly more difficult to achieve as carrier frequency increases. Such narrow bandwidths also require holding the accuracy and stability of the filter center frequency to comparable precision. This is compounded when the filter must be tunable.

In response to the aforementioned difficulties, super-heterodyne has been implemented to address the aforementioned difficulties. In a super-heterodyne receiver, the high radio frequency (RF) is converted to a lower, (super-audio) intermediate frequency (IF), of which the channel bandwidth is of a much greater proportion. For example, a 30 kHz channel at the fairly common IF of 10.7 MHz would require a Q of 350, which is readily achievable at this frequency.

In a heterodyne system, tuning is controlled by the local oscillator (LO). Selectivity, or reception bandwidth, is defined by the IF filter characteristic and is typically narrow. The frequency window of the IF filter characteristic is made to slide across the RF band. The center frequency of reception sensitivity is defined by the LO and the IF. Holding the combined accuracies of the local oscillator frequency and the center frequency of the IF filter is more readily achieved as compared to holding the accuracy of the center frequency of a narrow band, high frequency filter alone. Maintaining fixed reception bandwidth as the tuning frequency scans the RF band has become desirable.

Further, a filter is required in the RF amplifier ahead of the frequency conversion stage so as to reject the unwanted image frequency which is inherent in the basic heterodyning process. It is also advantageous to optimize the amplifier gain in the desired frequency range and more importantly, restrict the total power that the RF amplifier must handle. At a carrier frequency in the range of 250 MHz, an RF filter with a 2 MHz bandwidth, for example, would need a Q of only 125. If tracking of the RF filter center frequency is required, this precision also may be proportionately relaxed. To achieve an RF bandwidth of 2 MHz at 2 GHz carrier, however, would still require a fairly high Q of about 1000. This is one reason wide-tuning-range, high-frequency receivers typically employ double and triple conversion heterodyne systems.

Further, the implementation of the aforementioned RF filters would typically require strip-line, ceramic cavity, acoustic resonant, surface-acoustic-wave (SAW) devices or conventional inductors and accompanying capacitors. The aforementioned components require a significant space and have a substantial associated cost. Moreover, some of these components may require hermetic packages.

Another associated disadvantage is that, in view of the small physical space which is available in a miniature radio receiver, only a restricted energy source may be implemented therein. Therefore, the components of such a radio receiver must have a low power consumption in view of the restricted energy source. Further, the aforementioned dielectric based micro-strip and strip-line filters typically operate in an environment of the order of 50Ω impedance or less, thus requiring a large supply current from the aforementioned small restricted energy source.

SUMMARY OF THE INVENTION

The present invention relates to an RF filter adapted for use in a monolithic integrated circuit arrangement. The RF filter of the present invention provides an alternative arrangement in contrast to a conventional RF filter which typically includes relatively bulky and expensive external components.

The RF filter in accordance with the present invention includes an amplifier whose gain may be affected by an immittance connected between two nodes within the amplifier. In an example embodiment, said amplifier comprises a common emitter differential RF amplifier having first and second transistors and having said immittance coupled between the respective emitters of the first and second transistors. In the prior art, the immittance might include an inductor and a capacitor. In the example embodiment, the common emitter differential amplifier is operative to have a large gain when at resonance and a corresponding lesser gain when away from resonance, whereby the impedance is low at resonance and is correspondingly high when away from resonance.

The present invention further provides a circuit arrangement for implementing the aforementioned RF filter so as to provide RF selectivity by translating the frequency characteristic of a frequency selective immittance network from audio frequency (AF) to RF. The circuit arrangement includes an AF selective immittance network coupled to the aforementioned RF amplifier and a commutating bridge of bilateral switching devices, preferably field effect transistors (FETs), which couple the AF selective immittance network to a gain affect port of the aforementioned RF amplifier. An RF local oscillator is further provided and is coupled to the bridge of bilateral switching devices and is operative to force-commutate the bridge of bilateral switching devices. Therefore, the AF selective immittance network is coupled to the voltage and current derived from the gain affect port of the RF amplifier, through the forced-commutated bridge, wherein such voltage and current is translated down in frequency. The RF amplifier is further coupled to the admittance of the AF selective immittance network which is reflected back through the forced-commutated bridge and is translated back up again in frequency.

BRIEF DESCRIPTION OF THE DRAWINGS

The foregoing features of the present invention will become more readily apparent and may be understood by referring to the following detailed description of an illustrative embodiment of an apparatus according to the present invention, taken in conjunction with the accompanying drawings, in which.

DETAILED DESCRIPTION OF THE PREFERRED EMBODIMENTS

Figure 1:
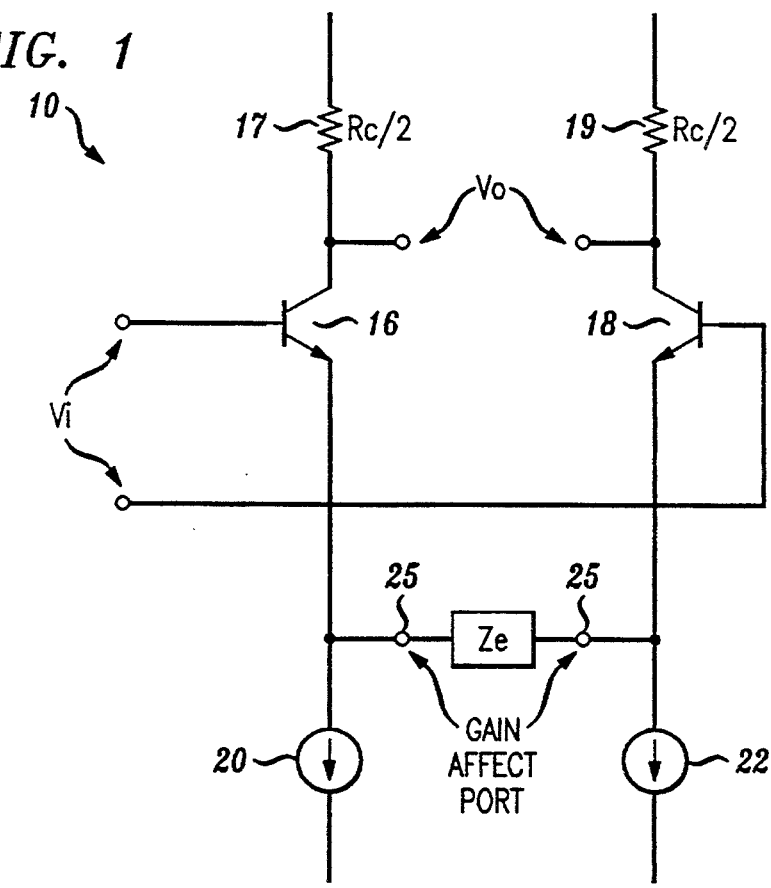
FIG. 1 illustrates an example embodiment of an amplifier whose gain may be affected by an immittance connected between two nodes within the amplifier.

Referring now to the drawings, in which like reference numerals identify similar or identical elements, FIG. 1 illustrates a common emitter differential amplifier 10 having an impedance $Z_e$ connected between the respective emitters of transistors 16 and 18. Resistors 17 and 19 having a resistance of $R_c/2$ are respectively coupled to the collector of each respective transistor 16 and 18. A pair of current means 20 and 22 provide a suitable emitter bias current, such that the amplifier voltage gain approaches the ratio $R_c/Z_e$, wherein the transistors 16 and 18 are infinite gain transistors. It is appreciated that the respective emitters of transistors 16 and 18 may be viewed as the gain affect port 25 of the amplifier 10.

If the impedance $Z_e$, (or its reciprocal: $Y_e = 1/Z_e$) has a characteristic that varies as a function of frequency, then the gain of the amplifier 10 will vary with the aforementioned frequency function. For example, if $Z_e$ is a series inductor-capacitor (L-C), its impedance is typically low at resonance and high when away from resonance. This will impart a characteristic to the amplifier 10 which makes the amplifier gain high at resonance and low when not at resonance. Hence, the aforementioned characteristic is similar to that of a bandpass filter.

Thus, it is apparent that a comparable effect will be achieved for any immittance network, $Z_e$, regardless of its complexity or how it may be synthesized. For example, any one of a number of transfer functions may be synthesized (i.e., $V_{out}/V_{in}$, $i_{in}/V_{in} = Y/in$). In accordance with the present invention, the transfer function of interest is the immittance (either impedance or admittance) function which is the ratio of voltage and current at the same port of an amplifier. It is noted that an immittance network, or its dual, may be connected to any amplifier, between two nodes within a loop that will affect its gain so as to achieve similar results.

In the event that sufficient stop-band rejection (the frequency response region in which the signal is attenuated) cannot be achieved within a single stage, several frequency-tailored stages may be employed in tandem to one another (not shown). This provides distribution of the systems rejection burden while repeatedly disrupting unwanted signals into submission. Further, the transfer function may be divided into simpler parts, similar to a Sallen-Key synthesis as disclosed in "A practical Method of Designing RC Active Filters," R. P. Sallen and E. L. Key, IRE Transactions—Circuit Theory, Pp 74–85, March, 1955, incorporated herein by reference.

It is to be appreciated that a category of filters which are capable of achieving complex, high order functions and are amenable to monolithic integration is to be termed "symbolic" filters. Symbolic filters are to be defined as filters which process a representation of an actual signal. For example, this category of filters (symbolic filters) would include resistor-capacitor (R-C) active implementations, gyrators, a charge coupled device (CCD) tapped delay-line, switched capacitor, and numeric digital signal processors (DSPs).

In particular, symbolic filters are advantageous in that since gain is present, symbolic filters can more easily achieve higher effective Q's than can their passive physical counterparts i.e., transmission-line-stub filters, strip-line filters, waveguide filters, resonant cavity filters and dielectrically loaded versions of an inductor-capacitor (L-C), piezoelectric resonator, and surface-acoustic-wave (SAW) devices and hence, a more complete range of functions is attainable. For example, a digital (numeric) symbolic filter is advantageous in such a situation because the computation can be carried to arbitrary precision providing accurate realizations.

Symbolic filters are most effective at modest, base-band frequencies in the audio frequency (AF) region. It is noted that symbolic filters by themselves are not readily adaptable to radio frequency (RF) applications. Discrete time implementations, such as CCD, switched capacitor and DSP types are limited by maximum sampling and/or processing rates. The near-ideal gain characteristics of active circuits that make their functions operate effectively at modest frequencies give way to parasitics as the frequency increases. At high frequencies, the eigen functions or poles and zeros of the gain elements fall within the range of those of the design function and consequently, conflict with them. Therefore, the transfer functions realized may differ substantially from the design intent.

Figure 2:
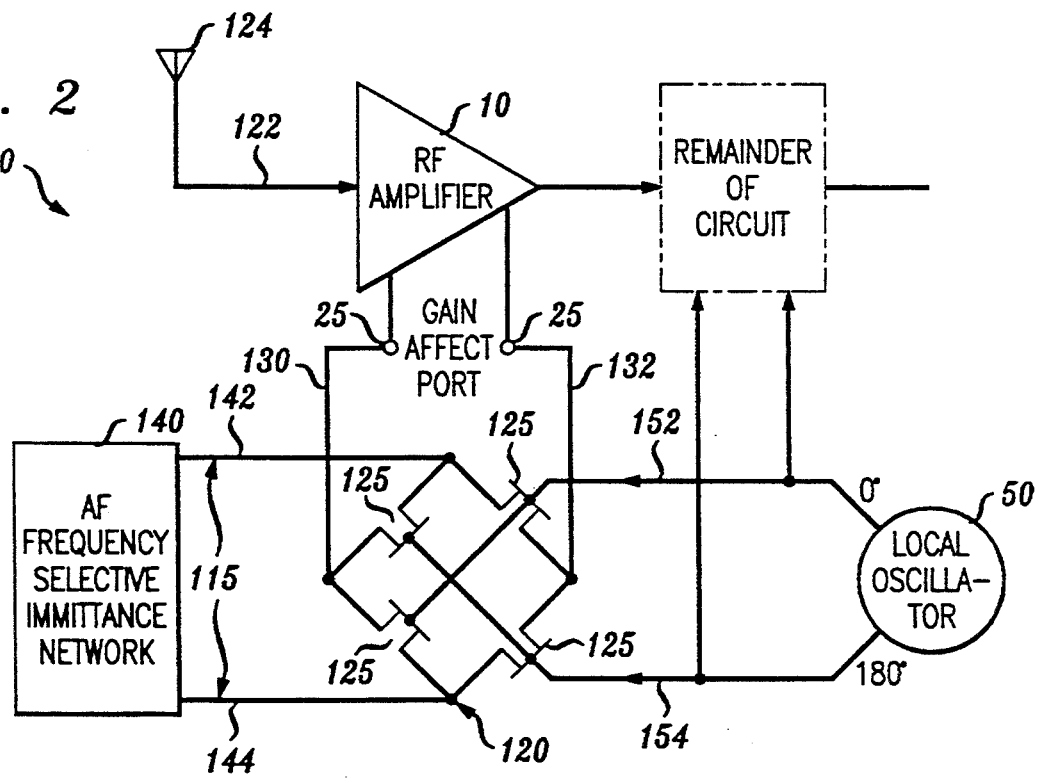
FIG. 2 illustrates a frequency translated filter in accordance with the present invention.
Figure 4:
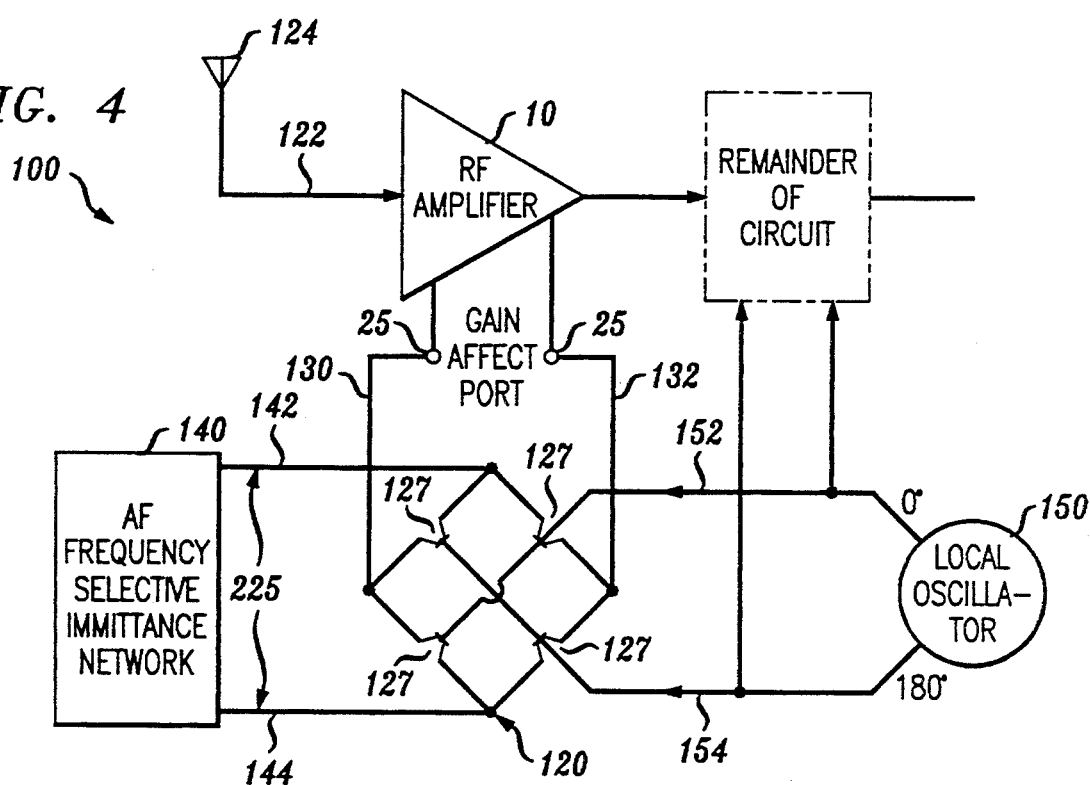
FIG. 4 illustrates a frequency translated filter of FIG. 1 illustrating a forced-commutated bridge of bilateral switching elements consisting of bipolar junction transistors.
Figure 5:
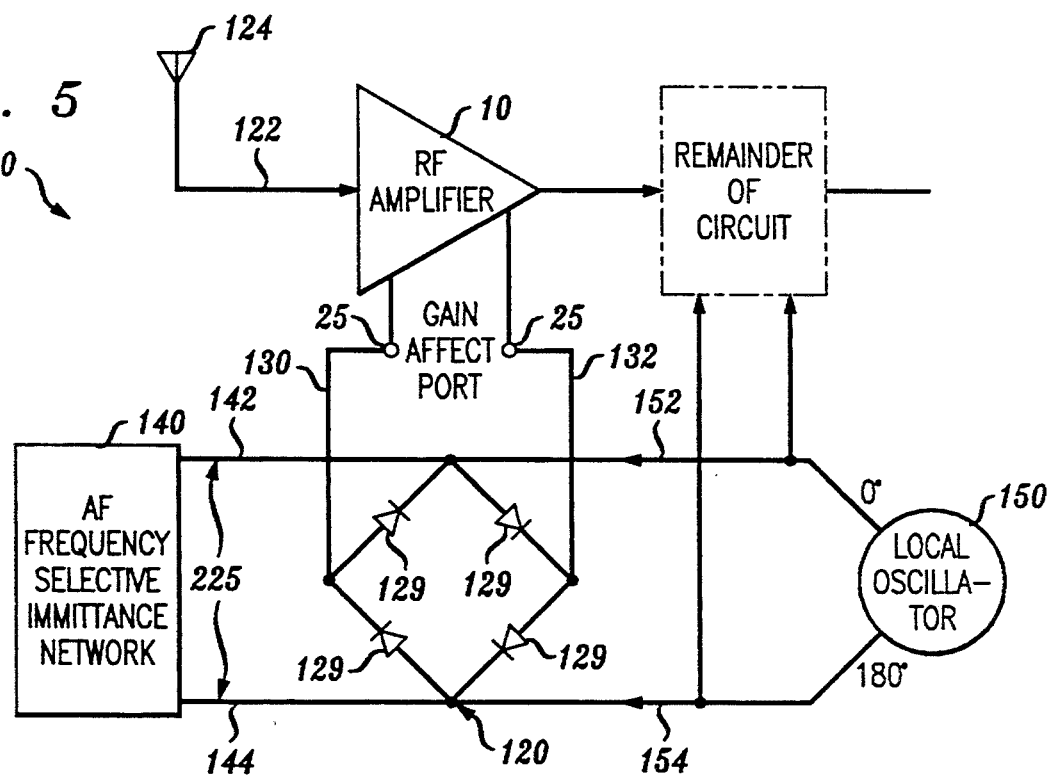
FIG. 5 illustrates a frequency translated filter of FIG. 1 illustrating a forced-commutated bridge of bilateral switching elements consisting of diodes.
Figure 6:
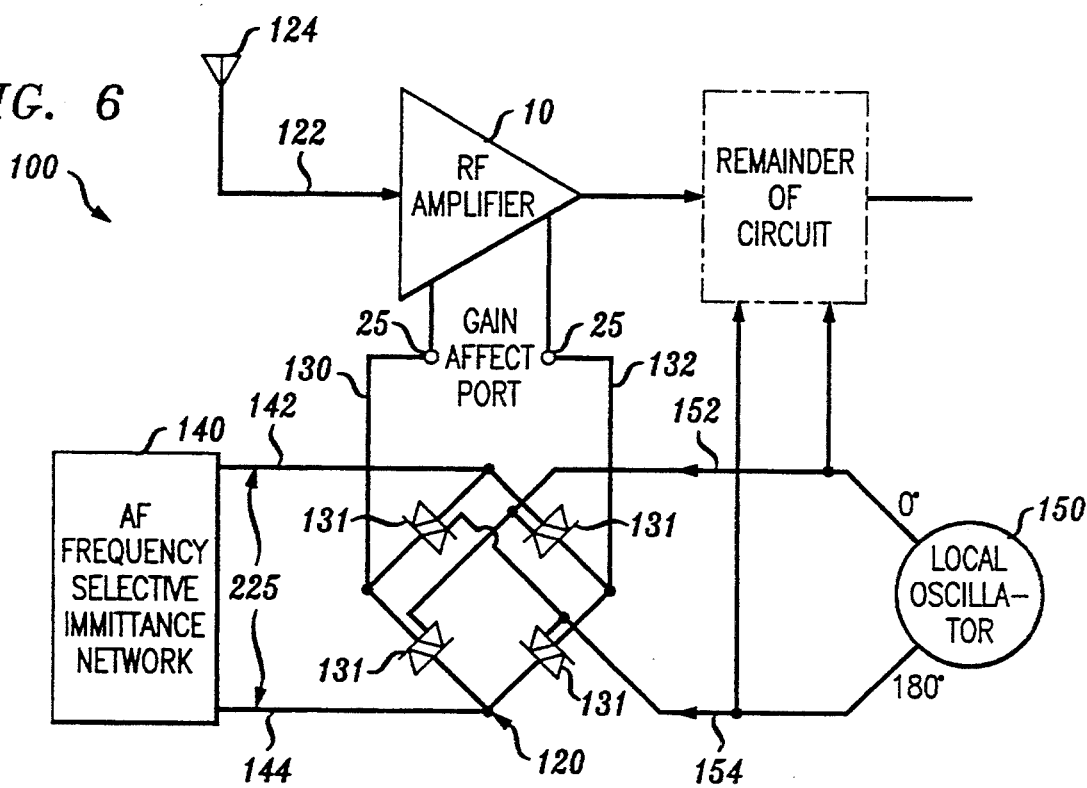
FIG. 6 illustrates a frequency translated filter of FIG. 1 illustrating a forced-commutated bridge of silicon controlled rectifiers.
Figure 7:
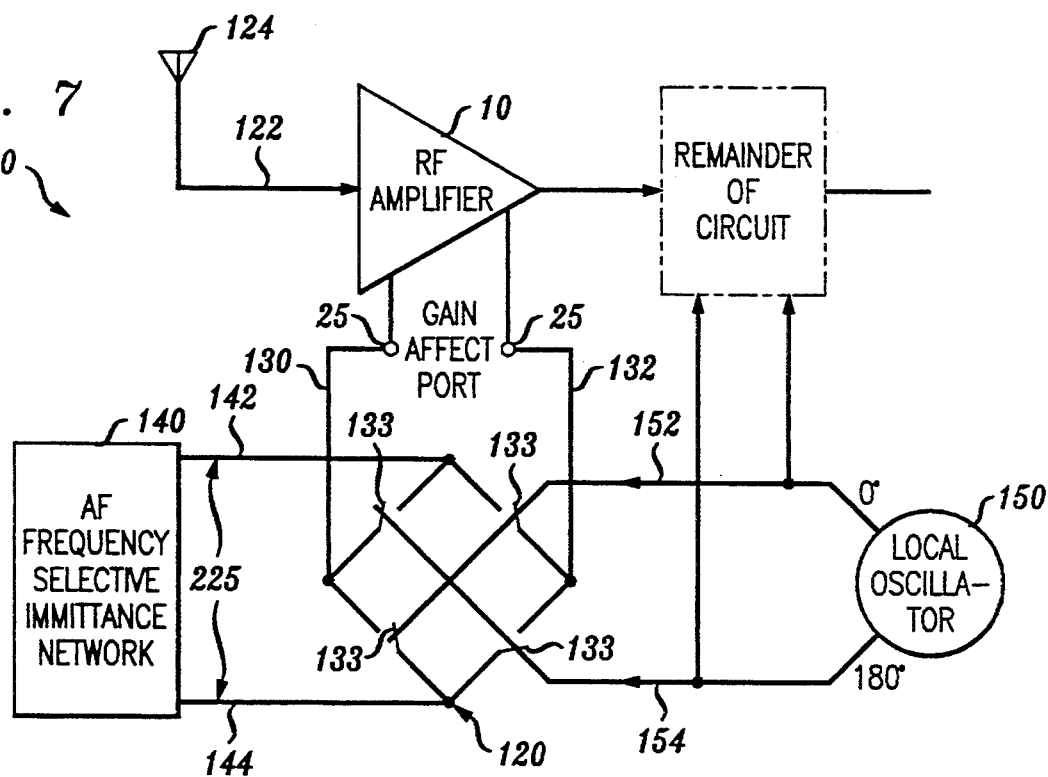
FIG. 7 illustrates a frequency translated filter of FIG. 1 illustrating a forced-commutated bridge of mechanical contacts.

Referring now to FIG. 2, there is illustrated a circuit arrangement, designated by the reference numeral 100, adapted to implement AF symbolic filters in RF amplifiers. The circuit arrangement 100 includes a commutating bridge arrangement 120 which includes a plurality of bilateral switching devices 125. The bilateral switching devices 125 are preferably field effect transistors (FETs), but it is to be understood by one skilled in the art that bridge arrangement 120 is not to be limited to FETs but may encompass many differing types of components, such as bipolar junction transistors 127 (as shown in FIG. 4), diodes 129 (as shown in FIG. 5), silicon controlled rectifiers 131 (as shown in FIG. 6), mechanical contacts 133 (as shown in FIG. 7), etc.

The RF amplifier 10 is coupled via line 122, to an antenna 124 adapted to receive and transmit messages and/or data. The gain affecting port 25 of the RF amplifier 10 is coupled via lines 130 and 132, through the channels of the FETs 125 of commutating bridge arrangement 120, and via lines 142 and 144, to the AF frequency selective immittance network 140. An RF local oscillator 150 is connected via lines 152 and 154 to the gates of FETs 125 of the commutating bridge arrangement 120. The commutating bridge arrangement 120 is forced-commutated by the RF local oscillator 150.

The commutating bridge arrangement 120 functions in a manner similar to that of a doubly balanced mixer in which the switching devices 125, under the control of local oscillator 150, convert the RF signal appearing at the gain affect port 25 of RF amplifier 10 to a new frequency at the port 225 of AF frequency selective immittance network 140. The AF frequency selective immittance network 140 encounters the voltage and current from the gain affecting port 25 of the RF amplifier 10, through the commutating bridge arrangement 120, whereby said encountered voltage and current is translated down in frequency. The RF amplifier 10 will encounter the network admittance characteristic, reflected back through the commutating bridge 120, which is translated back up again in frequency.

For example, the admittance function of the network 140 can be defined by:

$$i_n/v_n = y_n$$

wherein the voltage and current at the terminals of the frequency selective gain determining immittance network 140 is defined by:

$$v_n(t) = \int_{\omega_m=-M}^{+M} A(\omega_m)\cos\omega_m t \, d\omega_m$$

$$i_n(t) = \int_{\omega_m=-M}^{+M} B(\omega_m)\cos\omega_m t \, d\omega_m$$

wherein $-M < \omega_m < +M$ establishes a band of interest over which the frequency characteristic of the admittance function is defined. The commutating function is then defined by:

$$F_{lo}(t) = \cos \omega_c t$$

wherein $\omega_c$ is the frequency of the local oscillator. Taking the product of the above commutating function, the input voltage and current to the gain affecting port of the amplifier 10 is defined by:

$$v_a(t) = \int_{\omega_m=-M}^{+M} 1/2 \, A(\omega_m)[\cos(\omega_m + \omega_c)t + \cos(\omega_m - \omega_c)t]d\omega_m$$

$$i_a(t) = \int_{\omega_m=-M}^{+M} 1/2 \, B(\omega_m)[\cos(\omega_m + \omega_c)t + \cos(\omega_m - \omega_c)t]d\omega_m$$

and the admittance presented at the gain affecting port of the amplifier 10 is defined by:

$$y_a = i_a/v_a$$

which resembles the baseband frequency characteristic of the gain determining immittance network 140, with the exception that it is translated up in frequency and is centered about $\omega_c$. Thus, the voltage and current at the gain affecting port of the amplifier 10 is coupled to the gain determining immittance network 140 at baseband frequencies. Therefore, a network 140 implemented at AF is made to affect the frequency characteristic of an amplifier 10 at RF.

Figure 3A:
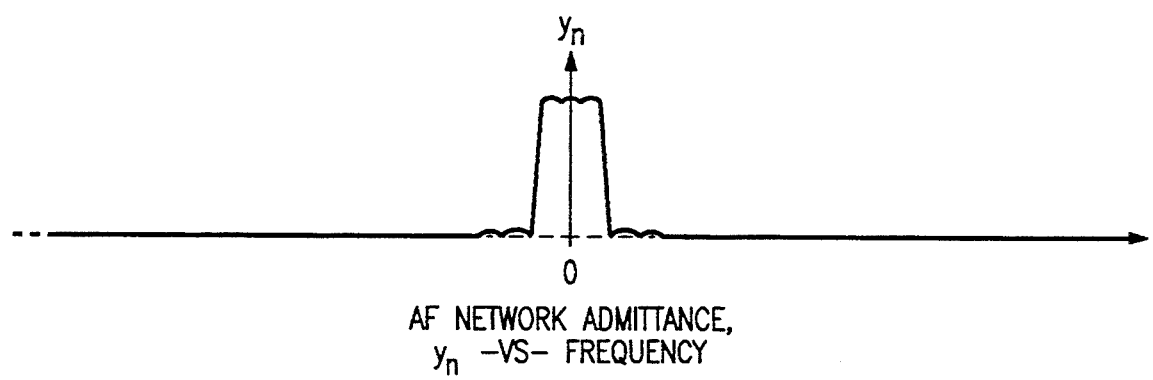
FIG. 3a illustrates a graphical representation of admittance ($Y_n$) vs. frequency ($\omega$) of the AF Network of FIG. 2.
Figure 3B:
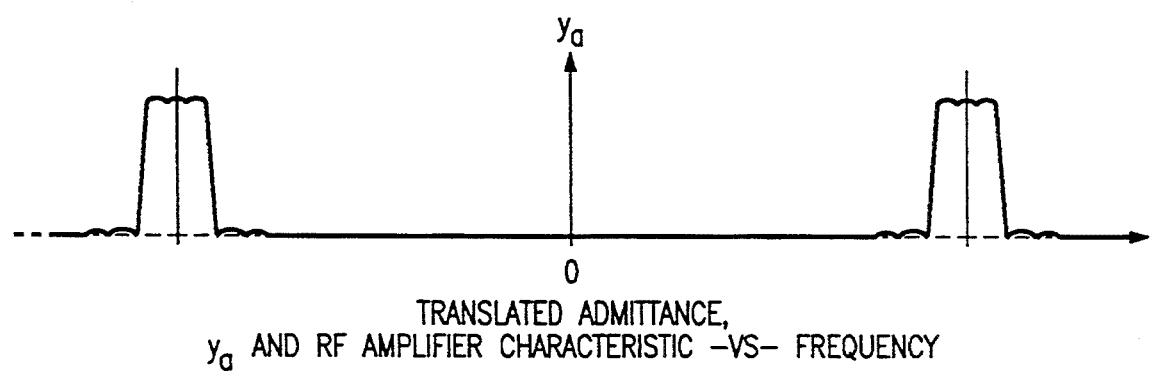
FIG. 3b illustrates a graphical representation of translated admittance ($Y_a$) vs. frequency ($\omega$) of the AF Network of FIG. 2.

For example, referring to FIGS. 3a and 3b, if a lowpass characteristic is chosen for the gain determining immittance network (FIG. 3a), the RF amplifier 10 will exhibit a bandpass characteristic whose bandwidth is twice the lowpass corner frequency and whose center frequency is the LO frequency (FIG. 3b). Since the AF baseband gain determining immittance network 140 can be synthesized to have a transfer function with an arbitrarily narrow bandwidth and/or arbitrarily steep skirts in addition to symmetry, the resultant RF characteristic will consequently inherit these traits. Further, the center frequency of the resultant RF filter in the amplifier 10 will inherently track the RF local oscillator 150.

In order to preserve the character of the AF frequency selective immittance network 140 through its frequency translation, it is necessary to drive the switching devices 125 of the commutating bridge arrangement 120 between their lowest electrical resistance states and their highest electrical resistance states. Because of this, the commutating function will contain odd harmonics in addition to the fundamental. This can result in unwanted conversion products of RF signals at these harmonic frequencies.

This condition can be mitigated by applying to the gates of the switching device 125 a square wave commutating function operating at a higher frequency than the desired local oscillator frequency, but containing primarily the fundamental of the desired local oscillator frequency. Such square wave commutating function may be produced by the application of pulse-width modulation, sigma-delta modulation or the like.

It is to be appreciated that the aforementioned circuit arrangement 100 is particularly adapted to be compatible in homodyne reception arrangements, wherein the RF local oscillator 150 can be utilized for both filter translation and for demodulation. However, it is noted that the aforementioned circuit arrangement 100 is not to be limited to a homodyne arrangement as it is to be understood that the circuit arrangement 100 may be implemented in numerous circuit schemes.

What has been described is merely illustrative of the application of the principles of the present invention. Other arrangements and methods can be implemented by those skilled in the art without departing from the spirit and scope of the invention.

What is claimed is:

1. A filter for implementation in an integrable RF amplifier, said filter comprising:
   a) an amplifier having a gain affecting port;
   b) a gain determining immittance;
   c) a forced-commutated bridge of bilateral switching elements interconnecting said gain affecting port within said amplifier and said gain determining immittance; and
   d) a commutating drive signal source connected to said bridge, for affecting said forced-commutation and producing a commutating function.

2. A filter as recited in claim 1, wherein said gain affecting port includes two nodes, said filter further including a gain determining immittance connected between said two nodes for affecting the gain of said amplifier.

3. A filter as recited in claim 1, wherein said amplifier is an RF amplifier.

4. A filter as recited in claim 1, wherein said amplifier having said gain affecting port includes:
   a) a common emitter differential amplifier having first and second transistors;
   b) first and second collector feed resistors providing an output signal from said amplifier;
   c) a plurality of current sources for providing biasing; and
   d) first and second nodes provided at the emitters of said first and second transistors adapted for connection to said gain determining immittance.

5. An integrable filter as recited in claim 4, wherein said emitters of said first and second transistors are operative to provide a gain affecting port for said common emitter differential amplifier.

6. A filter as recited in claim 1, wherein said forced-commutated bridge of bilateral switching elements includes a plurality of bipolar junction transistors.

7. A filter as recited in claim 1, wherein said forced-commutated bridge of bilateral switching elements includes a plurality of diodes.

8. A filter as recited in claim 1, wherein said forced-commutated bridge of bilateral switching elements includes a plurality of silicon controlled rectifiers.

9. A filter as recited in claim 1, wherein said forced-commutated bridge of bilateral switching elements includes a plurality of mechanical contacts.

10. A filter as recited in claim 1, wherein said commutating drive signal source includes a local oscillator.

11. A filter as recited in claim 1, wherein said commutating drive signal source is a sinusoidal signal at a fundamental frequency.

12. A filter as recited in claim 1, wherein said commutating drive signal source is a square wave signal at a fundamental frequency.

13. A filter as recited in claim 1, wherein said commutating drive signal source includes a high frequency square wave with the fundamental frequency of a desired sinusoid pulse-width modulated onto it.

14. A filter as recited in claim 1, wherein said commutating drive signal source includes a high frequency square wave with the fundamental frequency of a desired sinusoid sigma-delta modulated onto it.

15. A filter as recited in claim 1, wherein said gain determining immittance is frequency selective.

16. A filter as recited in claim 15, wherein said frequency selective gain determining immittance is a filter function which exhibits an in-band and an out-of-band characteristic.

17. A filter as recited in claim 16, wherein said filter function is a low-pass filter.

18. A filter as recited in claim 16, wherein said filter function is a band-pass filter.

19. A filter as recited in claim 16, wherein said filter function is an audio frequency filter.

20. A filter as recited in claim 16, wherein said frequency selective gain determining immittance exhibits a low impedance in-band and a high impedance out-of-band.

21. A filter as recited in claim 16, wherein said frequency selective gain determining immittance exhibits a high impedance in-band and a low impedance out-of-band.

22. A filter as recited in claim 1, wherein said forced-commutated bridge of bilateral switching elements includes field-effect transistors.

23. A circuit arrangement for providing RF selectively by frequency translation, said circuit arrangement comprising:
   a) a frequency selective immittance network;
   b) an RF amplifier having an RF integrated filter implemented therein, said RF amplifier having a gain affect port;
   c) a bridge of bilateral switching devices, said bridge being coupled to said frequency selective immittance network and to said gain affect port of said RF amplifier; and
   d) a RF local oscillator coupled to said bridge of bilateral switching devices, said RF local oscillator being operative to force commutate said bridge of bilateral switching devices whereby said frequency selective immittance network is coupled to the voltage and current associated with said gain affect port of said amplifier through said forced-commutated bridge translated down in frequency.

24. A circuit arrangement for providing RF selectivity by frequency translation as recited in claim 23, whereby said frequency selective immittance network is adapted to be operative in the baseband frequencies of the audio frequency region.

25. A circuit arrangement for providing RF selectivity by frequency translation as recited in claim 24, wherein said RF integrated filter includes:
   i) a common emitter differential amplifier having first and second transistors; and
   ii) an impedance coupled between the respective emitters of said first and second transistors whereby said common emitter differential amplifier is operative to have a large gain when in-band and a lesser gain when not in-band.

26. A circuit arrangement for providing RF selectivity by frequency translation as recited in claim 25, wherein said bridge of bilateral switching devices includes field effect transistors.

27. A circuit arrangement for providing RF selectivity by frequency translation as recited in claim 26, wherein the voltage and current of said frequency selective immittance network is defined by:

$$v_n(t) = \int_{\omega_m=-M}^{+M} A(\omega_m)\cos\omega_m t \, d\omega_m$$

$$i_n(t) = \int_{\omega_m=-M}^{+M} B(\omega_m)\cos\omega_m t \, d\omega_m$$

wherein $-M < \omega_m < +M$ and $\omega_m$ provides a band for which the frequency characteristic of an admittance function for said immittance network is defined.

28. A circuit arrangement for providing RF selectivity by frequency translation as recited in claim 27, wherein the commutating function of said bridge is defined by:

$$F_{lo}(t) = \cos \omega_c t$$

wherein $\omega_c$ is the frequency of said RF local oscillator.

29. A circuit arrangement for providing RF selectivity by frequency translation as recited in claim 28, wherein the voltage and current input to said gain affect port of said RF amplifier are respectively defined by:

$$v_a(t) = \int_{\omega_m=-M}^{+M} 1/2 \, A(\omega_m)[\cos(\omega_m + \omega_c)t + \cos(\omega_m - \omega_c)t]d\omega_m$$

$$i_a(t) = \int_{\omega_m=-M}^{+M} 1/2 \, B(\omega_m)[\cos(\omega_m + \omega_c)t + \cos(\omega_m - \omega_c)t]d\omega_m.$$

* * * * *